United States Patent

Sakata

Patent Number: 5,226,812
Date of Patent: Jul. 13, 1993

[54] VERTICAL TYPE HEAT-TREATING APPARATUS

[75] Inventor: Kazunari Sakata, Sagamihara, Japan

[73] Assignee: Tokyo Electron Sagami Kabushiki Kaisha, Japan

[21] Appl. No.: 831,066

[22] Filed: Feb. 4, 1992

[30] Foreign Application Priority Data

Feb. 26, 1991 [JP] Japan .................. 3-103694

[51] Int. Cl.⁵ .............................. F27D 3/12
[52] U.S. Cl. .................... 432/241; 432/253
[58] Field of Search .......... 432/241, 205, 206, 152, 432/253, 5, 6

[56] References Cited

U.S. PATENT DOCUMENTS

| | | | |
|---|---|---|---|
| 4,610,628 | 9/1986 | Mizushina | 432/253 |
| 4,976,613 | 12/1990 | Watanabe | 432/241 |
| 4,981,436 | 1/1991 | Watanabe | 432/241 |

*Primary Examiner*—Henry C. Yuen
*Attorney, Agent, or Firm*—Beveridge, DeGrandi, Weilacher & Young

[57] ABSTRACT

A vertical type of heat-treating apparatus is provided with a housing that has an opening portion for the carrying in of an object to be processed to the front surface, a heat-treating furnace for performing the required heat-treatment to the object to be processed and which is provided inside the housing, a standby space for the standby of the objects to be processed and carried into the heat-treating apparatus which is provided underneath the heat-treating furnace, a cleaning air introduction opening provided to a lower portion of the housing, a feed path separated from the standby space and connected to the cleaning air introduction opening, a recirculation path which makes one portion of cleaning gas passed the standby space to flow once again to the standby space, and an air exhaust opening for the exhaust to outside the housing of cleaning air which passes through the standby space.

10 Claims, 4 Drawing Sheets

VERTICAL TYPE HEAT-TREATING APPARATUS

BACKGROUND OF THE INVENTION

The present invention relates to vertical type heat-treating apparatus.

In general, in heat-treating apparatus which are used in film formation processes or heat dispersion processes in the manufacturing processes of semiconductor devices, vertical type heat-treating apparatus, are widely used to reduce contamination and to save the space required.

Such vertical type heat-treating apparatus are provided with a reaction tube which is formed in a cylindrical shape, and a heat-treating furnace comprising heaters and thermal insulation material which surround the heat-treating furnace and which are provided vertically inside a housing which is substantially rectangular in shape. Furthermore, the lower portion of the heat-treating furnace provided inside the housing is provided with a standby space in which wafer boards which carry many semiconductor wafers, for example, and which are the object of processing are kept prior to processing. These wafer boards are carried into and out of the heat-treating furnace by raising and lowering means such as a board elevator or the like which moves up and down, and enables processing to be carried out by a processing gas. Then, an air exhaust mechanism is provided to the heat-treating apparatus so that the high temperature unit and the processing gas which remain inside the heat-treating furnace and which are discharged from the heat-treating furnace, can be discharged to outside of the furnace.

Because there is such a mechanism, vertical types of heat-treating apparatus have far less installation space when compared to the horizontal type thereof. Furthermore, it is possible to load and unload the wafer boards to inside the heat-treating furnace without direct contact with the reaction tubes. Because of this, it is possible to have less contamination for the entire apparatus.

Also, with the vertical type of heat-treating apparatus, even less contamination is promoted by a cleaning gas being taken in through a dust removal filter and then into the standby space so that the adhesion of contaminating particles to the semiconductor wafers in the standby space is prevented. Furthermore, the cleaning gas that passes through this standby space is exhausted to a clean room which is provided for the maintenance of the heat-treating apparatus, and to a separate maintenance room.

However, with todays increased requirements for mass production, higher levels of integration and increasing levels of fineness for semiconductor devices, the degree of cleanliness of clean rooms is required to be of class 10 or more (i.e. 10/ft$^3$ for particles of 0.2 $\mu$m). However, with a conventional heat-treating apparatus as described above, a configuration where a cleaning gas which has been taken in once is discharged to the maintenance room, it is difficult to maintain the degree of cleanliness of the maintenance room at, for example, even class 100/ft$^3$. Because of this, the particles which are discharged from the heat-treating apparatus leak through the apparatus from the side of the maintenance room to the side of the clean room and adhere to the semiconductor wafers being processed to, therefore, cause the problem of a reduced yield. In particular, the ultrafineness accuracy of semiconductor wafers continues to become smaller and currently there is the transition from a minimum dimension of 1.0 $\mu$m to 0.5 $\mu$m and so it is strongly desirable that the industry solve this problem.

Not only this, when there is the heat-treatment of semiconductor devices, various types of toxic gases such as phosphine ($PH_3$), arsenic (As) and the like are used as the processing gases. Conventionally, the amounts of these processing gases used, have been relatively small and only a small amount of toxic gas remains inside the heat-treating apparatus, thereby making it possible to perform sufficient exhausting of the air by using an exhaust mechanism provided at the entrance to the heat-treating apparatus. Because of this, it was possible to maintain the required degree of cleanliness even if the cleaning gas that passes through the standby space formed inside the heat-treating apparatus was exhausted in the same state to the maintenance room.

However, the sizes of semiconductor wafers themselves are becoming larger and there is the tendency to change from sizes such as five or six inches, for example, to eight inches and there is also the tendency for the amounts of the processing gases used to increase. Because of this, it is not possible to perform sufficient exhausting with an exhaust mechanism as has been conventionally provided to the entrance of the heat-treating apparatus, and there is the same problem of the level of safety that the toxic gases propose to the operators who operate the apparatus inside the clean room.

In particular, the injection operation of impurities such as P or As or the like that are introduced when doping is performed to the semiconductor wafers has been conventionally performed by ion injection apparatus or the like. However, with these apparatus, there are various types of problems concerning the difficulty of making the semiconductors finer and which are due to the thermal efficiency and the thermal dispersion which accompanies annealing after the injection of ions. Because of this, recent technological development has meant that ion introduction processes such as these tend to be carried out at the same time as the film formation processes in vertical heat-treating apparatus, and this means that it is also desirable that this problem be eliminated.

SUMMARY OF THE INVENTION

In the light of this, the present invention has as an object the provision of a vertical type of heat-treating apparatus which can maintain the required level of cleanliness of the atmosphere in the standby space of the heat-treating apparatus, and furthermore, maintain the level of cleanliness of the atmosphere of the clean room without deterioration of the level of cleanliness of the maintenance room, and through this, greatly improve the yield of the object being processed, and effectively exclude the residual toxic gas which is used in the heat-treating apparatus.

The present invention relates to a vertical type of heat-treating apparatus which is provided with a housing having an opening portion for the carrying in of an object to be processed to the front surface, a heat-treating furnace for performing the required heat-treating to the object to be processed and which is provided inside the housing, and a standby space for the standby of the objects to be processed and which are carried into the heat-treating apparatus provided underneath the heat-treating furnace, and a recirculation path that is provided with a cleaning air introduction inlet for the introduction of cleaning air to the standby space via an air feed path, an air exhaust opening for the exhaust to outside of the housing of the cleaning air which passes through the standby space, which recirculates one portion of the cleaning air that passes the standby space to the feed path and which feeds it again to the standby space, and which supplies a gas that is discharged from the exhaust opening to a required exhaust processing system provided outside the apparatus.

The vertical heat-treating apparatus of the present invention is configured as described above and takes a cleaning gas from the cleaning gas introduction opening to inside the housing, and implements side flow which removes particles from a semiconductor wafer or some other object to be processed which is in standby in the standby space. The cleaning gas which has passed through this standby space is gathered and is exhausted from the exhaust opening to outside the housing, and is supplied and proceed to an exhaust processing system of the plant via a duct system or the like. In addition, one portion of the cleaning gas that has passed through the standby space is recirculated to the recirculation path and is returned once again to the standby space. By this arrangement, it is possible to supply a large amount of clean gas to the standby space.

DETAILED DESCRIPTION OF THE PREFERRED EMBODIMENTS

The following is a detailed description of one embodiment of the vertical type of heat-treating apparatus of the present invention, with reference to the appended drawings.

Figure 1:
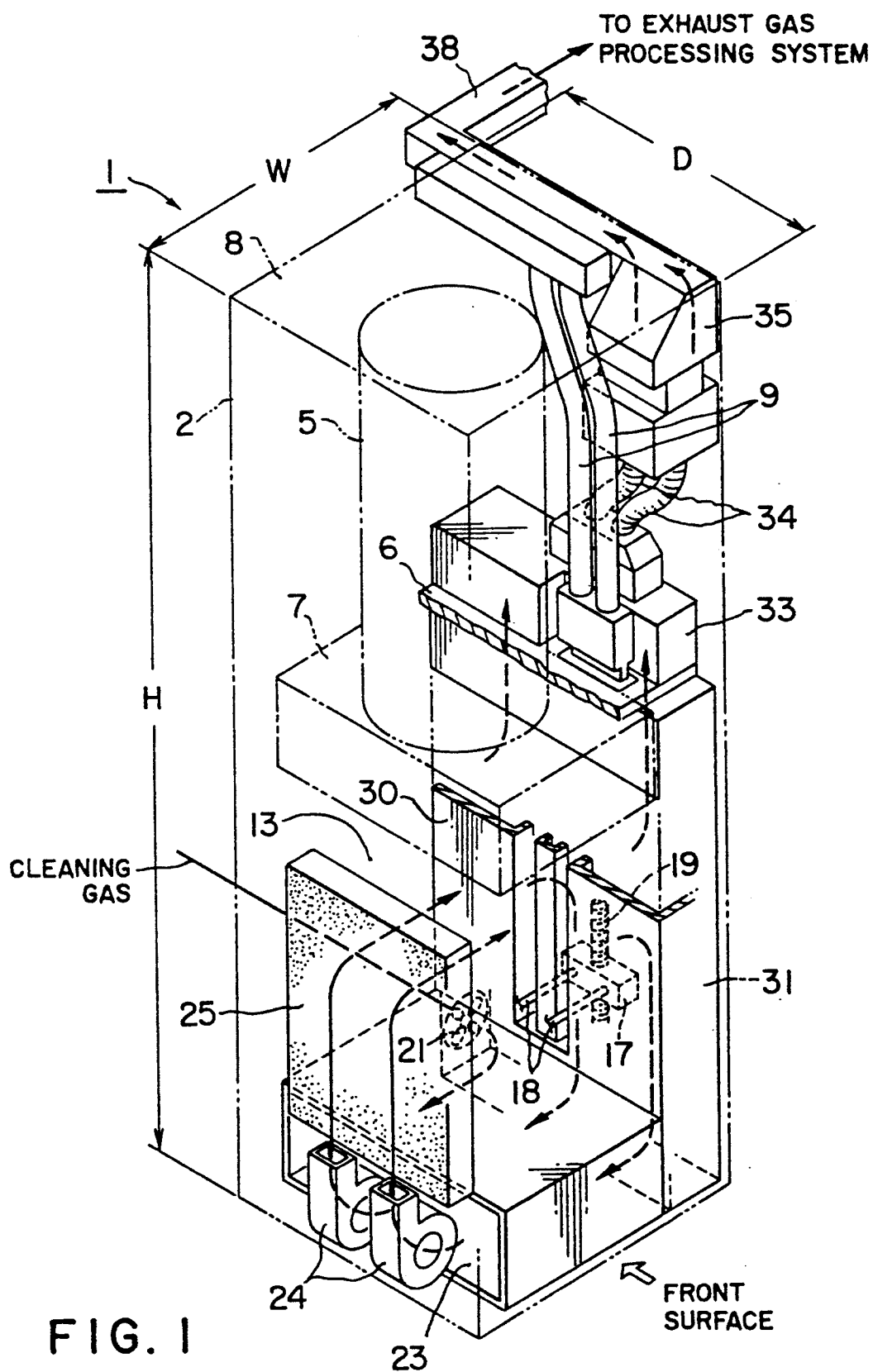
FIG. 1 is a perspective view of the entire mechanism of one embodiment of the vertical heat-treating apparatus of the present invention.
Figure 2:
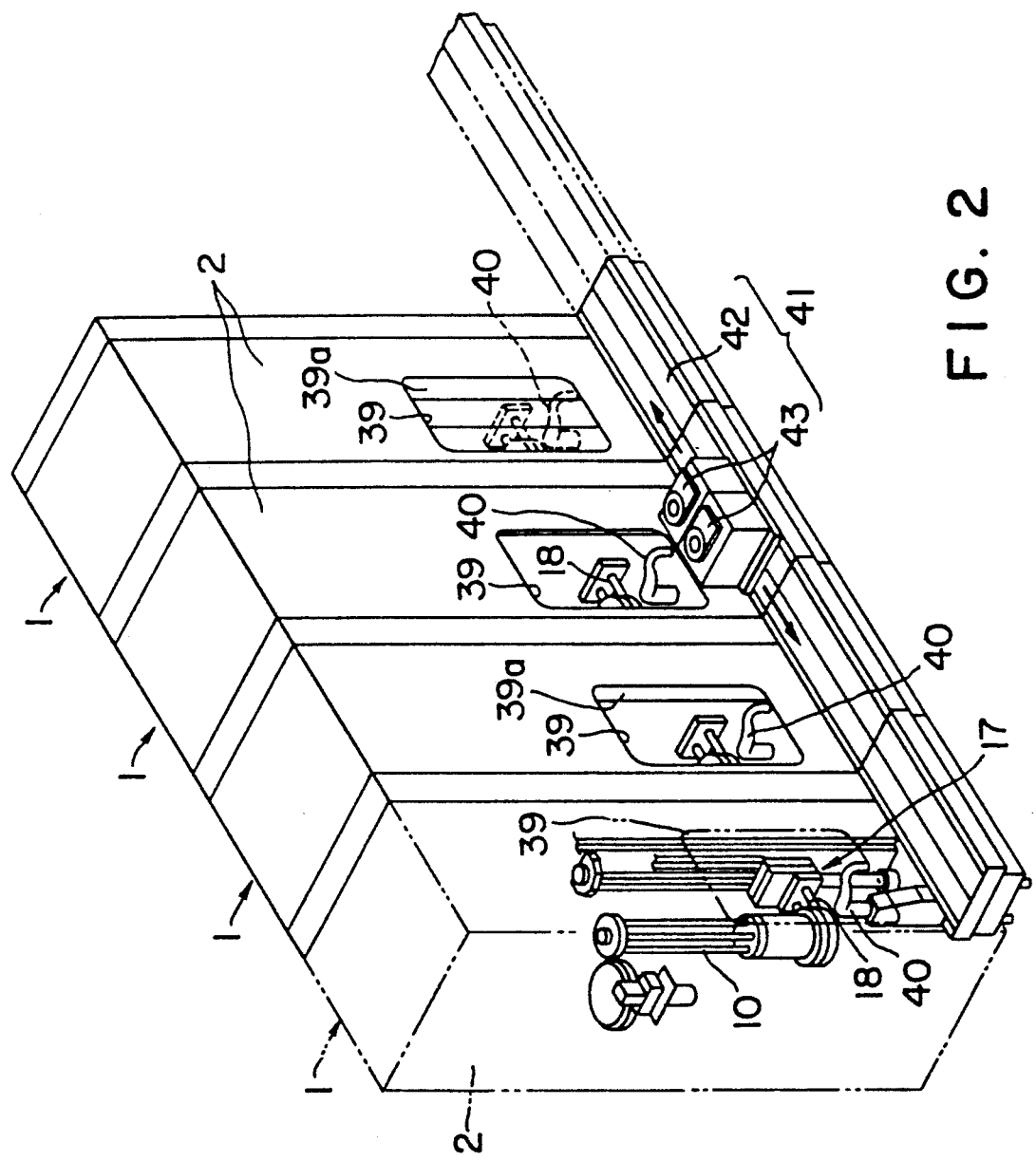
FIG. 2 is a layout figure describing the installation status of the vertical type of heat-treating apparatus shown in FIG. 1.
Figure 3:
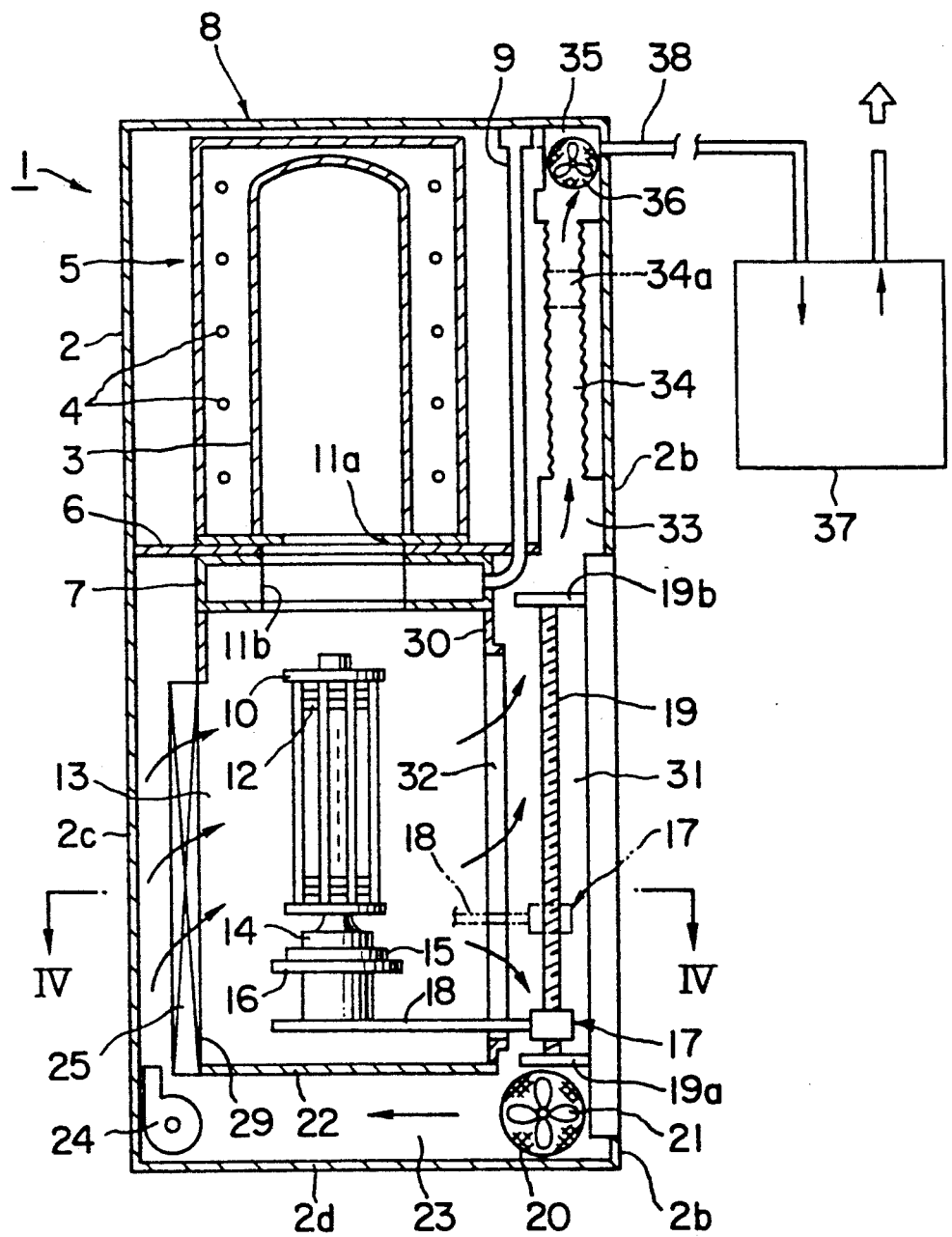
FIG. 3 is an outline vertical sectional view of the vertical type of heat-treating apparatus shown in FIG. 1.

As is shown in FIGS. 1 through 3, the vertical heat-treating apparatus of the present invention is configured from a housing 2 which is freely openable and closable and which is formed from a steel plate or the like so as to be substantially rectangular in section. The housing 2 has a width W of 950 mm, a depth D of 900 mm, and a height H of 2800 mm for example.

In particular, as shown in FIG. 3, the upper portion of the housing 2 is provided with a reaction tube 3 formed in a cylindrical shape of a material such as glass or the like, and a heat-treating furnace 5 comprising heaters 4 and thermal insulation material and the like which surround the reaction tube 3, and is supplied with processing gas and is provided so as to be substantially vertical. The lower distal end portion of the heat-treating furnace 5 is fixed and supported by a base plate 6 of stainless steel or the like and which is fixed horizontally to substantially the center portion of the housing 2.

In addition, to the lower portion of the base plate 6 is provided a scavenger 7 formed in a box shape from stainless steel for example, which discharges the high-temperature gas and the processing gas that is discharged from the furnace outlet of the heat-treating furnace 5 and which remains inside the furnace. To the side surface portion of this scavenger 7 is formed a thermal exhaust gas duct 9 that is connected to the exhaust gas opening 35 which extends to the ceiling portion, 8 of the housing portion 2, and holes 11a, 11b which are provided downwards from the substantially central portion of the scavenger 7 and the base plate 6 are formed so that the wafer board 10 of glass or the like can be easily carried into and from the the heat-treating furnace 5.

Downwards from the scavenger 7 is formed the standby space 13, and the object to be processed, such as a semiconductor wafer 12 for example, which is carried into and from the heat-treating furnace 5, remains in this standby space for a certain time before and after processing. In addition, a wafer board 10 is formed upright on a temperature retaining plate 14 comprised of glass or the like, and many semiconductor wafers 12 are stacked and arranged inside this wafer board 10 at a required pitch. This wafer board 10 is on standby in the standby space 13.

The temperature retaining plate 14 is fixed onto a turntable 15 which is freely rotatable by a drive means (not shown). To the lower portion of this turntable 15 is formed a cap portion 16 of circular shape which airtightly seals the hole 11a of the heat-treating furnace 5 when the wafer board 10 is carried into the heat-treating furnace 5. Here, the temperature retaining plate 14, the turntable 15 and the cap portion 16 are formed as a unit, and attached to the two arm portions 18 of the board elevator 17 which extends in the horizontal direction from one side of the lower portion inside the housing 2 of the heat-treating apparatus 1.

The board elevator 17 is arranged so as to move in the upwards and downwards direction of the housing 2. Both of its ends are pivoted to brackets 19a, 19b that are fixed to the side wall 2b of the housing 2, and it has a guide shaft 19 that is rotationally driven by a step motor (or the like (not shown). The guide shaft 19 has a screw thread along its outer periphery and this guide shaft 19 is rotated. An arm which has a ball screw at its base end engages the guide shaft so as to be raised and lowered as shown by the virtual line in FIG. 3, thereby enabling the wafer board 10 to be raised and lowered inside the standby space 13 and carried into and from the heat-treating furnace 5. Furthermore, a cover (not shown) is provided in the scavenger 7 so as to close the hole 11a as an opening when the wafer board 10 is carried from the heat-treating furnace 5.

Figure 4:
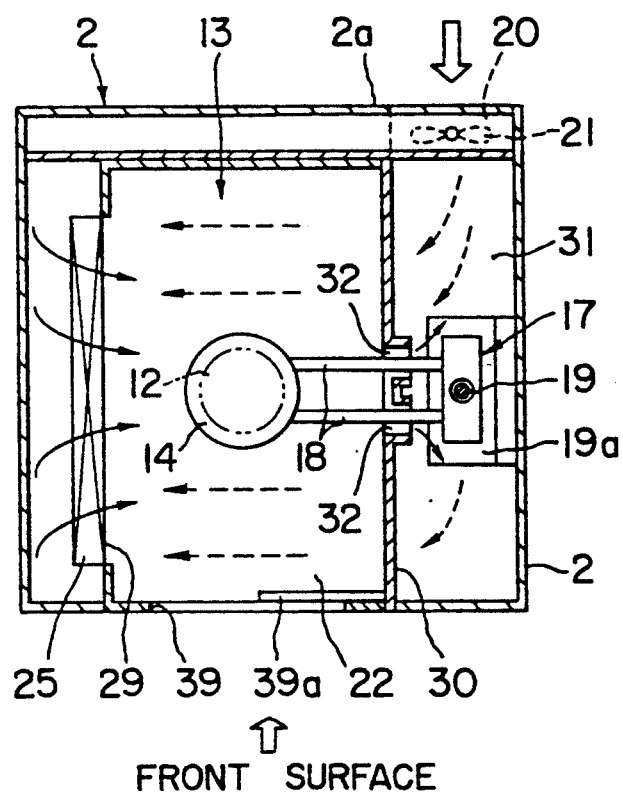
FIG. 4 is a perspective sectional view along the section line IV—IV of FIG. 3.

On the other hand, as shown in FIG. 4, the rear wall 2a of the lower end portion of the board elevator 17, that is, the rear wall 2a of the housing 2 at the lower right back when seen from the front surface of the heat-treating apparatus 1 has formed in it a cleaning gas introduction opening 20 for the introduction of cleaning gas into the heat-treating apparatus 1 so that it flows into the standby space 13. A gas supply means such as a fan 21 is attached so as to force feed cleaning gas into the heat-treating apparatus 1, and is provided to the cleaning gas introduction opening 20. Also, to the vicinity of the fan 21 is provided a flow regulation and adjustment damper (not shown) so as to suitably adjust the amount of flow of the cleaning gas that is supplied.

Also, a lower portion partition wall 22 which is formed of steel plate or the like and which functions as a central partition is provided to the lower portion of the housing 2 at a required distance from the base plate 2a the housing, so as to supply the cleaning gas introduced into the heat-treating apparatus 1 from the introduction side on the lower portion of the housing 2 to the other side. By this, the gas flow path 23 shown in FIG. 3 is formed between the lower portion partition wall 22 and the base plate 2d of the housing. To the lower portion on the left side when seen from the front of the housing 2 are installed, for example, two fan units 24 in parallel so as to feed the cleaning gas which has been sent from the cleaning gas introduction opening 20 upwards from the lower portion of the housing 2. Also, upwards of the fan unit 24 is uprightly provided a punching metal 29 so as to lean towards the front surface of the standby space 13. Across substantially the entire front surface of this punching metal 29 is arranged a .dust removal filter 25 comprising a HEPA (High-Efficiency Particulate Air) filter for example. The cleaning air flow from this dust removal filter 25 has the dust removed and the flow adjusted to flow in the substantially horizontal direction into the standby space 13.

On the other hand, the surface which opposes this filter 25 is provided with an elevator cover 30 comprising stainless steel for example, for covering the board elevator 17 and separating it from the standby space 13. Then, a recirculation path 31 which extends in the vertical direction is formed between the elevator cover 30 and the side wall 2b of the housing 2 which is attached to the board elevator 17, and the cleaning gas which passes the standby space 13 and which is made a slide flow so as to exhaust particles from the semiconductor wafer 12 is recirculated to the recirculation path 31.

As has been described above, the elevator cover 30 has two gaps 32 formed in it so as to pierce the two arm portions 18 of the board elevator 17 and move it in the upwards and downwards direction as shown in FIG. 4, these are formed along the upwards and downwards direction of the housing 2. Moreover, the periphery of the two gaps 32 can form a boss portion for reinforcement as shown in FIG. 4. Because of this, one portion of the cleaning air which passes the standby space 13 passes these gaps 32 and flows into the recirculation path 31. The lower end portion inside the recirculation path 31 is connected to the gas flow path 23 and one portion of the cleaning air which flows into this recirculation path 31 is led to the lower portion partition wall 22 and is recirculated.

On the other hand, to the upper portion of this recirculation path 31, a gas collection box 33 is provided so as to collect most of the gas, and is connected to a cleaning gas exhaust duct 34 which extends to the ceiling portion 8 of the housing 2 and is connected to an exhaust opening 35. In addition, to the right upper side portion of the rear wall 2a of the housing 2 is provided the exhaust opening 35 to discharge the cleaning gas to outside of the housing 2, and to this exhaust opening 35 is connected to a cleaning gas exhaust duct 34. Then, inside this exhaust gas opening 35 is provided an exhaust fan 36 as a gas supply means for supplementing the gas flow loss caused by piping conductance inside the cleaning gas exhaust duct 34, and this exhaust gas opening 35 is connected to the cleaning gas exhaust duct 34 described above. In addition, in the vicinity of the exhaust fan 36 is provided a flow amount adjustment damper (not shown). Moreover, along the cleaning gas exhaust duct 34 can be provided an activated charcoal filter 34a to exhaust one portion of the cleaning air to the atmosphere (the cleaning room) immediately after it has been filtered.

To the outer side of the exhaust gas opening 35 is connected an exhaust processing duct 38 so as to lead the exhaust gas from the apparatus 1 to a required exhaust gas processing system 37 of the plant and that includes a dust removal apparatus for example. By this, the cleaning air which has been exhausted is supplied to exhaust gas processing system without being discharged to the maintenance room.

In addition, as shown in FIG. 2, to the lower portion of the front of each of the housings 2 of the apparatus 1 is formed an opening portion 39 which is slightly larger than the dimension of the wafer board 10, so that the wafer board 10 can be easily carried into and from the heat-treating apparatus 1. To this opening portion 39 is provided a slider door 39a which is air driven for example, and this slider door 39 closes to freely seal the apparatus. In addition, to the vicinity of this opening portion 39 is provided a moving arm 40 which moves to above the two arm portions 18 of the board elevator 17.

The heat-treating apparatus 1 of the present invention and having the configuration as described above is normally provided as a plural number such as four units as shown in the example in FIG. 2. Then, to the front surface of each of the heat-treating apparatus 1 are provided board conveyor mechanisms 41 to freely move along the front surface of the heat-treating apparatus 1 and convey the wafer board 10 that mount and house the semiconductor wafers 12 which are to be processed or which have been processed. These board conveyor mechanisms 41 are configured from a feed rail 42 which is provided along the direction of the heat-treating apparatus 1, and a board mounting portion 43 which mounts the wafer board 10 on the rail 42 and moves opposite the front surface of the heat-treating apparatus 1 when there is no wafer board mounted.

To the distal end of the feed rail 42 and no shown in the figure are provided a carrier stocker which can house many wafer carriers which house a plural number such as 25 semiconductor wafers for example, a wafer mounting mechanism which mounts semiconductor wafers 12 inside the wafer carrier to a wafer board 10, or a board transport mechanism or the like that performs horizontal-vertical conversion of the wafer boards 10 between the wafer mounting mechanism 41.

Moreover, in this embodiment, in the status where the semiconductor wafers 12 are mounted to the wafer board 10, the description was given for the batch method where the wafer boards 10 move between the board conveyor mechanism 41 and the heat-treating apparatus 1.

However, the present invention is not limited to this as for example, it is also possible to have a configuration wherein another type of sealed apparatus such as a wafer cassette housing a plural number of semiconductor wafers 12 is incorporated into a plural number of apparatus, and where the semiconductor wafers 12 move freely between a wafer board 10 and a wafer cassette inside the apparatus 1.

The following is a description of the operation and an embodiment of the heat-treating apparatus 1 of the present invention and having the configuration described above.

First, mechanisms for board feed and wafer feed from a carrier stocker (not shown) are used and wafer boards 10 which are in the upright status where a plural number of semiconductor wafers which are the object of processing are housed vertically, are mounted on a board mounting portion 43 of a board feed mechanism 41, and move on the feed rail 42 to the front surface of an opening portion 39 of a required heat-treating apparatus 1. Then, the slider door 39a is driven by compressed air or the like to open the opening portion 39 and the feed arm 40 is used to move the wafer board 10 which is mounted on the board feed portion 43 to on the two arm portions 18 of the board elevator 17. After the movement of the wafer board 10 has been completed, the slider door 39a of the opening portion 39 is closed and the heat-treating apparatus 1 is placed in the sealed status.

Prior to the movement of the wafer board 10 to the board elevator 17, the heat-treating furnace 5 is set to a required temperature in accordance with the heat-treating which is to be implemented and the exhaust fan 36, the fan unit 24 and the fan 21 which are provided to the required place inside the heat-treating apparatus 1 are rotationally driven. Because of this, the cleaning gas (air) which is taken into the heat-treating apparatus 1 by the base plate 21 from the cleaning gas introduction opening 20 passes through the gas flow path 23 which is formed in the bottom portion of the housing 2 and is blown upwards as shown in the figure, to the top of the housing 2 by the fan unit 24. After this, the cleaning gas passes through substantially the entire area of the dust removal filter 25 which is provided upright to the front surface of the standby space 13 and has dust removed and the flow adjusted and then becomes a side flow to flow substantially horizontally inside the standby space 13.

Here, side flow is implemented to the semiconductor wafers 12 which are placed on the wafer board 10 waiting inside the standby space 13 and the adhesion of dust to them is prevented. When this is done, the flow and speed of the cleaning gas is to the degree that no disturbances occur, and is desirably set to 0.3 to 0.4 m/sec.

Then, one portion of the cleaning gas which has passed inside the standby space 13 flows from the gap 32 formed on the elevator cover 30 provided so as to oppose the dust removal filter 25 and flows into the recirculation path 31. Here, one portion of the cleaning air flows downwards inside the recirculation path 31 to flow into the gas flow path 23 and be recirculated, and again flows into the standby space 13 as cleaning gas. On the other hand, the cleaning gas which remains inside the recirculation path 31 flows to the upwards of the housing 2, through the gas collection box 33 and the cleaning gas exhaust duct 34 to flow from the exhaust gas opening 35 due to the exhaust fan 36 and to be supplied to the exhaust processing system 37 from the exhaust processing duct 38.

Here, the cleaning gas inside the recirculation path 31 is forcedly exhausted by the exhaust fan 36 provided to the upper portion of the housing 2 and so it is possible to implement the required side flow to the semiconductor wafer 12 without the generation of air flow disturbances inside the standby space 13. Furthermore, when this is done, the air flow or the speed is suitably adjusted by the feed fan 21, the exhaust fan 36 and a flow regulation damper (not shown) provided in the vicinity of these.

In addition, the outer side of the exhaust gas opening 35 is connected to a exhaust processing duct 38 and so the cleaning gas which has the possibility of including dust that has been removed from the semiconductor wafer 12 is all supplied to a plant exhaust gas processing system 37 and is not directly exhausted to the maintenance room in the peripheral portion of the heat-treating apparatus 1. In particular, the cleaning gas is forcedly sucked into the exhaust processing duct 38 from the exhaust gas processing system 37 and the discharge of the cleaning gas is promoted.

On the other hand, after the required preparations have been completed, the semiconductor wafer 12 which is in the standby space 13 is loaded to and housed in the heat-treating furnace 5 by rotationally driving the guide shaft 19 and raising the board elevator 17. The required heat-treatment is then implemented to the semiconductor wafer 12 for the required time and temperature, in the required atmosphere and by the required processing gas. Even during the time which this heat-treatment is being performed, the cleaning gas flows into the standby space 13 at the required flow, the scavenger 7 is driven, and the heat is exhausted from the opening of the heat-treating furnace 5 to outside of the apparatus 1.

When the heat-treatment is completed, the processing gas inside the heat-treating furnace 5 is exhausted and the furnace 5 is filled with an inert gas such as nitrogen gas or the like, and the exhaust operation is repeated a plural number of times so that residual toxic gas inside the oven is sufficiently exhausted.

After this, a procedure the opposite of the loading procedure described above is used to unload semiconductor wafers which have undergone heat-treatment. From the heat-treating furnace 5 to the standby space 13, side flow of the cleaning gas is implemented, and the semiconductor wafers 12 are placed in the standby space 13 to discharge heat until their temperature drops to about 200° C. Then, the residual processing gas and the high-temperature gases that remain inside the furnace 5 after having been exhausted from the furnace opening of the heat-treating furnace 5, are sucked up by the scavenger 7 and are discharged to outside of the apparatus. Here, there is discharge of gas as toxic gas until the surface temperature of semiconductor wafers 12 which have been processed reaches about 200° C. Then, the residual heat of the semiconductor wafers 12 and one portion of the toxic gas is heated by heat transfer with the environed air and the heated air flows to the upper portion of the standby space 13 by convection thereof, and then is sucked up by the scavenger 7 and is discharged to outside of the housing 20 by a heat exhaust duct connected to it, and is processed by a toxic gas removal apparatus such as an exhaust gas processing system 37 and via an exhaust processing duct 38.

In addition, the particles and the residual toxic gas which cannot be exhausted by even the scavenger 7 and which remains inside the standby space 13 is discharged from the standby space by the side flow of the cleaning gas. These discharged particles and the residual toxic gas rise inside the housing 2 as shown by the arrow in FIG. 3, and are sent to the exhaust gas processing system 37 which is a detoxification and dust removing apparatus that has a cleaning gas exhaust duct 34 and an exhaust processing duct 38.

Because of this, there is no contamination of the maintenance room by toxic gas, and it is possible to sufficiently maintain the degree of cleanliness of the atmosphere of the maintenance room and the clean room, and it is possible to raise the yield of semiconductor devices.

Not only this, when there is standby for unloading, corrosive phosphor gas from the semiconductor wafers which have undergone heat-treatment is discharged and so unloading is detected, the rotation of the fan unit 24 is stopped, and the recirculation of this gas is prevented.

Then, when the temperature of semiconductor wafers which have undergone heat-treatment has dropped to approximately 200° C. or less, the slider door 39a of the opening portion 39 is opened and a procedure which is the reverse of the carrying in procedure described above is used to move the wafer board 10 to the board mounting portion 43 of the board conveyor mechanisms 41, and to convey it to a required place by the feed rail 42. Then, the same procedure as that described above is used to mount the wafer boards 10 of semiconductor wafers 12 which have not been processed, to the board mounting portion 43 and to convey them to the side of the heat-treating apparatus 1.

In this manner, in a heat-treating apparatus of an embodiment of the present invention, a large quantity of cleaning gas is made to flow into a standby space 13 irrespective of whether there is or there is not heat-treatment of semiconductor wafers 12, and one portion of this gas is recirculated, while that cleaning gas which is allowed to pass is not exhausted to a maintenance room, but is supplied to an exhaust gas processing system 37.

Because of this, it is possible to sufficiently maintain a degree of cleanliness of the atmosphere inside the maintenance room and the cleaning room. Therefore, it is possible to reduce the probability that dust or other particulate matter will attach itself to the semiconductor wafers, and thereby possible to improve the yield. According to embodiments of the present invention, the number of particles of 0.2 $\mu$m or more that attach to an 8-inch semiconductor wafer, was suppressed to within 10.

In addition, processing gases such as toxic gases which are generated from the semiconductor wafer after heat-treating and when there is heat discharge standby are not discharged to the maintenance room, but are processed by the exhaust processing system 37 so that it is possible to greatly improve the safety, and so there is no danger to the health of the operators. Also, one portion of the cleaning gas which passes through the standby space 13 is recirculated and so it is possible to have the flow of a large amount of cleaning gas to the standby space 13, and thus not only contribute to an improvement of the yield, but also prevent contamination of the dust removal filter 25.

I claim:

1. A vertical type of heat-treating apparatus, comprising:
    a housing having an openable portion at a front surface thereof for the carrying in of an object to be processed;
    a heat-treating furnace for performing a required heat-treatment to said object to be processed and which is provided inside said housing;
    a standby space for the standby of said object to be processed which is provided underneath the heat-treating furnace, said object to be processed being carried into said heat-treating furnace;
    a cleaning air introduction opening provided in said housing;
    a feed path separated from said standby space and connected to said cleaning air introduction opening;
    a recirculation path which causes a portion of cleaning gas which has passed through said standby space, to flow once again to said standby space; and
    an air exhaust opening for exhausting, outside the housing cleaning air which passes through said standby space.

2. The vertical type of heat-treating apparatus of claim 1, wherein:
    a feed fan is provided in the vicinity of said cleaning gas introduction opening.

3. The vertical type of heat-treating apparatus of claim 1, wherein:
    a feed fan is provided to said feed path.

4. The vertical type of heat-treating apparatus of claim 1, wherein:
    a dust removal filter is provided to the cleaning gas introduction side of said standby space.

5. The vertical type of heat treating apparatus of claim 1, wherein:
    an elevator cover is provided uprightly between a cleaning gas discharge side of said standby space and a side wall of said housing.

6. The vertical type of heat-treating apparatus of claim 1, wherein:
    a scavenger is provided to a lower portion of said heat-treating furnace, and a hot exhaust air duct connected to said exhaust gas opening is connected to said scavenger.

7. The vertical type of heat-treating apparatus of claim 1, wherein:
    said recirculation path and said exhaust gas opening are connected through a cleaning gas exhaust duct, and an exhaust fan is provided in the vicinity of said exhaust gas duct.

8. The vertical type of heat-treating apparatus of claim 1, wherein:
    said exhaust gas opening is connected to an exhaust gas processing system via an exhaust gas processing system duct.

9. The vertical type of heat-treating apparatus of claim 1, wherein:
    means for feeding an object to be processed is provided opposite said openable portion.

10. The vertical type of heat-treating apparatus of claim 1 wherein:
    said object to be processed is a semiconductor wafer.

* * * * *